United States Patent
Schulz

(10) Patent No.: US 11,810,888 B2
(45) Date of Patent: Nov. 7, 2023

(54) CURRENT SHUNT WITH REDUCED TEMPERATURE RELATIVE TO VOLTAGE DROP

(71) Applicant: Infineon Technologies AG, Neubiberg (DE)

(72) Inventor: Andreas Schulz, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/715,434

(22) Filed: Apr. 7, 2022

(65) Prior Publication Data

US 2023/0326900 A1     Oct. 12, 2023

(51) Int. Cl.
*H01L 23/00*     (2006.01)
*H02M 1/00*     (2006.01)

(52) U.S. Cl.
CPC ............. *H01L 24/37* (2013.01); *H01L 24/40* (2013.01); *H01L 2224/3701* (2013.01); *H01L 2224/37005* (2013.01); *H01L 2224/37013* (2013.01); *H01L 2224/37149* (2013.01); *H01L 2224/37171* (2013.01); *H01L 2224/40229* (2013.01); *H02M 1/0009* (2021.05)

(58) Field of Classification Search
CPC ...................................... H01L 24/37
USPC ........................................ 257/369
See application file for complete search history.

(56) References Cited

U.S. PATENT DOCUMENTS

| | | |
|---|---|---|
| 2010/0237982 A1 | 9/2010 | Brackhan et al. |
| 2011/0291741 A1* | 12/2011 | Mayer ................. H01L 23/5228 327/512 |
| 2014/0266269 A1 | 9/2014 | Ausserlechner et al. |
| 2015/0091551 A1 | 4/2015 | Kanschat et al. |
| 2017/0089955 A1 | 3/2017 | Yugou et al. |
| 2021/0225565 A1 | 7/2021 | Wolf et al. |
| 2023/0170316 A1* | 6/2023 | Nikitin ..................... H05K 1/11 257/776 |

OTHER PUBLICATIONS

Nikitin, Ivan, et al., "Solder Stop Feature for Electronic Devices", U.S. Appl. No. 17/537,822, filed Nov. 30, 2021, 1-34.
Unknown, Author, "Data sheets // ZERANIN® 30", Issue 29, Mar. 2014, 1-3.
"Using Current Sense Resistors for Accurate Current Measurement", BOURNS, Application Note, Jan. 1, 2018, pp. 1-11.

* cited by examiner

*Primary Examiner* — Ajay Arora
(74) *Attorney, Agent, or Firm* — Murphy, Bilak & Homiller, PLLC

(57) ABSTRACT

An electronic device includes a structured metallization layer including a plurality of contact pads that are electrically isolated from one another, and a metal clip connected in a current shunt measurement arrangement with a semiconductor device, wherein the metal clip includes first, second and third landing pads, a first bridge span connected between the first and second landing pads, and second bridge span connected between the second and third landing pads, wherein the first, second third landing pads are respectively thermally conductively attached to first, second and third contact pads from the structured metallization layer, and wherein the second mounting pad is electrically floating.

18 Claims, 5 Drawing Sheets

US 11,810,888 B2

CURRENT SHUNT WITH REDUCED TEMPERATURE RELATIVE TO VOLTAGE DROP

BACKGROUND

Power semiconductor devices and power electronic circuits constructed therefrom may be integrated into so-called power semiconductor modules (or power electronic modules). For example, power electronic converters (for example frequency converters, power inverters, etc.) may be integrated in a power semiconductor module. Power electronic converters constructed with the aid of power transistors (for example MOSFETs or IGBTs) may, for example, be used to drive electric motors. Another application involves inverters which, for example, convert direct current from solar plants into alternating current, so that the latter can be fed into the public power grid. In many power semiconductor applications it may be desirable or necessary to obtain a current measurement to determine, for instance, if a device is operating within a safe operation range. Existing techniques for obtaining current measurements suffer from drawbacks and may be incapable of providing an accurate current measurement in large current conditions, such as power applications wherein the operational currents are on the order of 10 A (amperes), 50 A or more.

SUMMARY

An electronic device is disclosed. According to an embodiment, the electronic device comprises a structured metallization layer comprising a plurality of contact pads that are electrically isolated from one another, and a metal clip connected in a current shunt measurement arrangement with a semiconductor device, wherein the metal clip comprises first, second and third landing pads, a first bridge span connected between the first and second landing pads, and second bridge span connected between the second and third landing pads, wherein the first, second third landing pads are respectively thermally conductively attached to first, second and third contact pads from the structured metallization layer, and wherein the second mounting pad is electrically floating.

A metal clip is disclosed. According to an embodiment, the metal clip comprises first, second and third landing pads, a first bridge span connected between the first and second landing pads, and a second bridge span connected between the second and third landing pads, wherein the metal clip is arranged to conduct a shunt current from the first landing pad to the third landing pad, wherein the first and second bridge spans comprise sections of a first conductive material that the shunt current must pass through, and wherein a temperature coefficient of the first conductive material is lower than that of the first, second and third landing pads.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A and 3B, illustrates a metal clip attached to a structured metallization layer, according to two different embodiments.

DETAILED DESCRIPTION

The embodiments described herein provide a metal clip that can be arranged as a current measurement shunt in an electronic device, such as a power module or a discrete package, and thereby used to measure an operational current of a component from the electronic device. The current measurement shunt advantageously comprises at least two bridge spans that each bridge a gap between landing pads of the current measurement shunt. The bridge spans can extend over and/or through an insulating region, such as a region of potting compound or epoxy. The landing pads of the current measurement shunt can comprise an electrically and thermally conductive metal such as copper, copper alloy, aluminum, etc., whereas the bridge spans comprise sections of resistive alloy, e.g., alloys comprising manganese and chromium. The multi-bridge configuration of the metal clip advantageously lowers the temperature of the material during operation by providing an intermediate heat dissipation region to extract heat that is generated from the resistive alloy by resistive heating. This allows for the metal clip to comprise a greater amount of resistive alloy and hence a higher electrical resistance without operating at dangerously high temperatures. The higher resistance in turn allows for more accurate current measurement.

Figure 1:
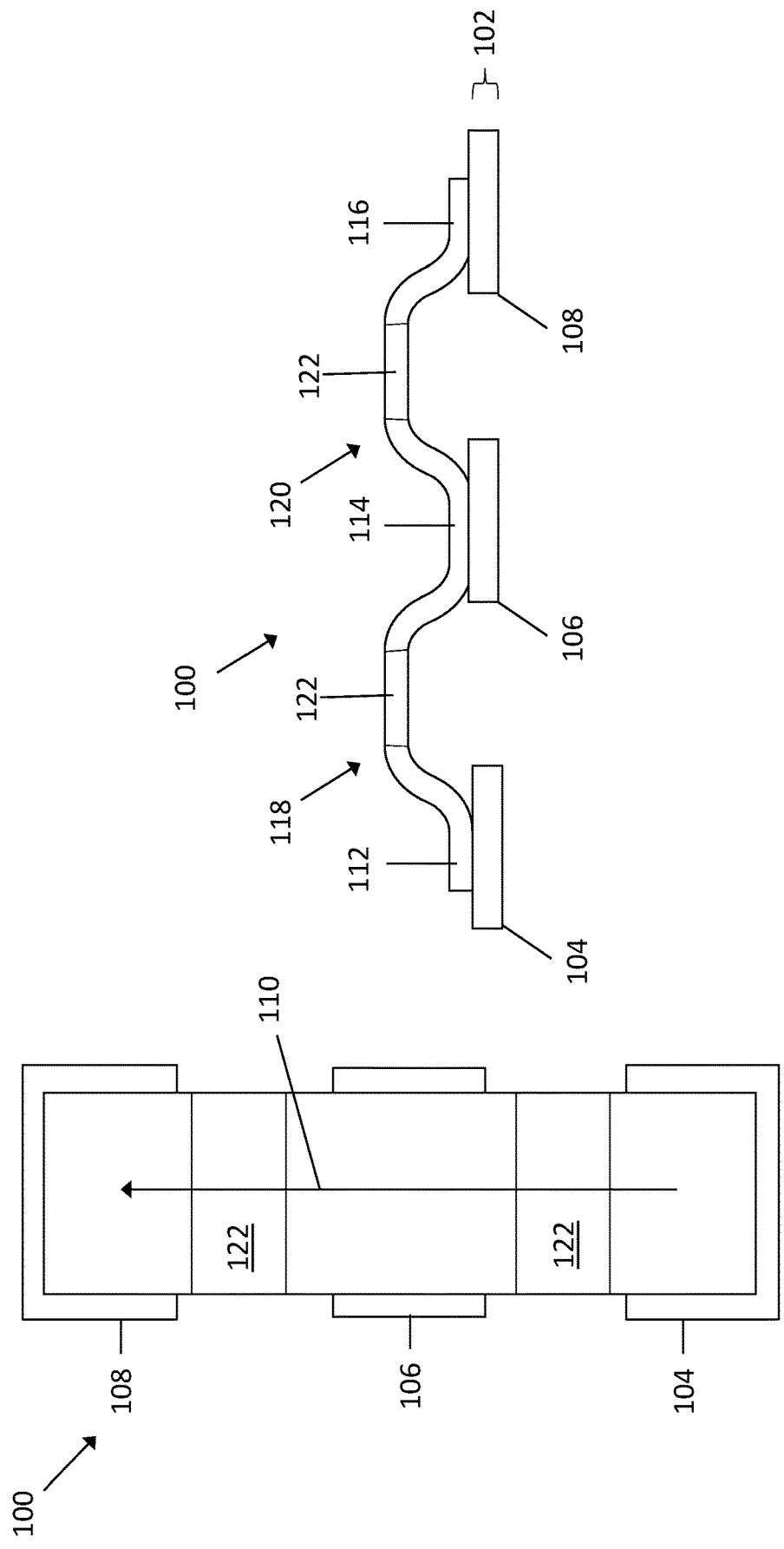
FIG. 1 illustrates a metal clip attached to a structured metallization layer, according to an embodiment.

Referring to FIG. 1, a metal clip 100 is depicted, according to an embodiment. The metal clip 100 is mounted on a structured metallization layer 102 that comprises a plurality of contact pads. The metal clip 100 and the structured metallization layer 102 are shown from a plan-view perspective on the left side of FIG. 1 and shown from a side-view perspective on the right side of FIG. 1.

The structured metallization layer 102 can be formed from or comprise an electrically conductive metal, e.g., Cu, Ni, Ag, Au, Pd, Pt and alloys thereof. According to an embodiment, the structured metallization layer 102 is an upper-level metallization from a circuit carrier. The circuit carrier can be a power electronics carrier, such as a Direct Copper Bonding (DCB) substrate, a Direct Aluminum Bonding (DAB) substrate, or an Active Metal Brazing (AMB) substrate, or an Insulated Metal Substrate (IMS). A power electronics carrier may comprise an insulating substrate (not shown in FIG. 1) underneath the structured metallization layer 102 of an electrically insulating material, e.g., ceramic material such as $Al_2O_3$(Alumina) AlN (Aluminum Nitride), or epoxy resin or polyimide in the case of an IMS substrate. Alternatively, the circuit carrier can be a printed circuit board (PCB), wherein the structured metallization layer 102 is formed on an electrically insulating substrate (not shown) that comprises a resin material such as FR-4. According to another embodiment, the structured metallization layer 102 is from a metal lead frame that is used in a discrete semiconductor package.

The structured metallization layer 102 comprises first, second and third contact pads 104, 106, 108. Each of these contact pads from the structured metallization layer 102 are electrically isolated from one another. This electrical isolation may be provided by the underlying substrate of a circuit carrier. Moreover, this electrical isolation may be provided by a dielectric medium (not shown) that the metal clip 100 and the structured metallization layer 102 are embedded within. The dielectric medium may be an electrically insulating encapsulant material, e.g., a potting compound such as a silicone based potting compound in the case of power module, or a molding compound comprising epoxy, thermosetting plastic, polymer, etc., in the case of a discrete semiconductor package.

According to an embodiment, the metal clip 100 is connected in a current shunt measurement arrangement with a semiconductor device. In this arrangement, an operational current from the semiconductor device flows into the metal clip 100 as a shunt current 110. The voltage drop across the metal clip 100 is measured to extrapolate the magnitude of the operational current. The semiconductor device to which metal clip 100 is connected in a shunt arrangement with can be any of a wide variety of semiconductor devices, e.g., power transistor, diode, passive device, etc. According to an embodiment, the metal clip 100 is arranged to measure an operational current of a power semiconductor die. A power semiconductor die refers to a single device that is rated to accommodate voltages of at least 100 V (volts), and more typically voltages of 600 V, 1200 V or more and/or is rated to accommodate currents of at least 1 A, and more typically currents of 10 A, 50 A, 100 A or more. Examples of power semiconductor dies include discrete power diodes and discrete power transistor dies, e.g., MOSFETs (Metal Oxide Semiconductor Field Effect Transistors), IGBTs (Insulated Gate Bipolar Transistors), and HEMTs (High Electron Mobility Transistors), etc. The operational current can be an output current of a power semiconductor die, e.g., a source-drain current in the case of a MOSFET, emitter-collector current in the case of an IGBT, and so forth.

In the current shunt measurement arrangement, the operational current of the device under measurement flows through the metal clip 100 as the shunt current 110 via the first and third contact pads 104, 108. Accordingly, a voltage measurement device may be connected between the first and third contact pads 104, 10 which correspond to first and second measurement nodes. Meanwhile, the second contact pad 106 may be electrically floating as the shunt current 110 does not flow through the second contact pad 106 in the current measurement shunt arrangement.

The metal clip 100 comprises first, second and third landing pads 112, 114, and 116. The first, second and third landing pads 112, 114, and 116 are sections of the metal clip 100 that are configured to be flush against and at least thermally connected to the contact pads of the structured metallization layer 102. To this end, the first, second and third landing pads 112, 114, and 116 may each comprise a substantially planar lower mounting surface, and the mounting surfaces from each of the first, second and third landing pads 112, 114, and 116 are substantially coplanar with one another. The first, second and third landing pads 112, 114, and 116 are respectively thermally conductively attached to the first, second and third contact pads 104, 106, 108 from the structured metallization layer 102. That is, there is a thermal coupling between the first, second and third landing pads 112, 114, and the first, second and third contact pads 104, 106, 108, respectively. A thermally conductive adhesive may be used to effectuate the connection between the first, second and third landing pads 112, 114, and 116 and the respective first, second and third contact pads 104, 106, 108.

For example, a joining material such as solder, sinter, conductive glue, etc. may be used to mechanically attach the metal clip 100 to each one of the first, second and third contact pads 104, 106, 108. These attachment materials may also provide an electrically conducive connection, which allows for the operational current of the device under measurement to flow through the metal clip 100 via the first and third contact pads 104, 108. As mentioned above, the second contact pad 106 may be electrically floating and thus does not require an electrically conductive joining material and/or the same joining material as the material used to join the first and third contact pads 104, 108. Accordingly, the material used to attach and thermally couple the second landing pad 114 to the second contact pad 106 may optionally include thermally conducive and non-electrically conductive materials such as thermal grease or thermal interface material.

According to the embodiment shown in FIG. 1, the metal clip 100 has a linear geometry whereby the shunt current 110 flows linearly between the first, second and third landing pads 112, 114, and 116. That is, the metal clip 100 is arranged so that a straight conduction path between the ends of the metal clip 100 exists along a current flow direction of the metal clip 100. A linear current in this context refers to the direction of current flow along one directional axis and can include currents that flow in multiple directions along another directional axis, e.g., in the depicted configuration the current flows linearly between the first and third landing pads 112, 116 along a lateral axis while changing direction along a vertical axis.

The metal clip 100 comprises a first bridge span 118 connected between the first and second landing pads 112, 114, and a second bridge span 120 connected between the second and third landing pads 114, 116. In this context, the term bridge refers to a section of the metal clip 100 that the shunt current 110 must pass through when flowing between two landing pads. As shown, the first bridge span 118 is elevated from the first and second landing pads 112, 114, meaning that a lower surface of the first bridge span 118 is vertically offset from the mounting surface of the first and second landing pads 112, 114. Likewise, the second bridge span 120 is elevated from the second and third landing pads 114, 116. This arrangement may allow for easier mounting of the metal clip 100. This arrangement is not necessary, however. Thus, in other embodiments, the first and second bridge spans 118, 120 may be arranged to be coplanar with the first, second and third landing pads 112, 114, and 116.

The first, second and third landing pads 112, 114, and 116 may be formed from a metal with low electrical resistance and high thermal conductivity. Examples of metals that meet this criterion include Cu, Al, Ag, Au, and alloys thereof. In a particular embodiment, the first, second and third landing pads 112, 114, and 116 are formed from copper or a copper alloy. The metal clip 100 can also comprise a coating or plating of different materials, e.g., Ni, Pd, Pt, or alloys thereof that are used as protective coatings and/or adhesion promotors. According to an embodiment, the sections of the metal clip 100 which form the first, second and third landing pads 112, 114, and 116 are provided by a uniform thickness sheet of metal, e.g., a planar sheet of copper, and the geometry of the first, second and third landing pads 112, 114, and 116 as described and depicted herein is created by metal processing techniques such as stamping, cutting, punching, etc.

The first and second bridge spans 118, 120 comprise sections of a first material 122 that is different from the material which forms the first, second and third landing pads 112, 114, and 116. The sections of the first material 122 may be welded to the thermally and electrically conductive metal which forms the first, second and third landing pads 112, 114, and 116, for example. The first material 122 has a higher electrical resistivity than the material which forms the first, second and third landing pads 112, 114, and 116. For example, the first material 122 may have an electrical resistivity that is between about 100 and 500 times greater than the electrical resistivity of the material which forms the first, second and third landing pads 112, 114, and 116. Separately or in combination, the sections of the first material 122 may account for between 90% to 99% of an overall electrical resistance of the metal clip 100. Additionally, the first material 122 has a lower temperature coefficient than the material which forms the first, second and third landing pads 112, 114, and 116. Temperature coefficient refers to the relationship between electrical resistivity of a material and the temperature of the material. Stated in numerical terms, the first material 122 may have a temperature coefficient of approximately 20 parts per million (ppm) per degrees Celsius at temperatures between 20° C. (degrees Celsius) and 60° C. Examples of materials that meet this requirement include resistive alloys of manganese and resistive alloys chromium. In an embodiment, the first material 122 is Zeranin®, which is a CuMn7Sn alloy material. Meanwhile, the temperature coefficient of the material which forms the first, second and third landing pads 112, 114, and 116 may be approximately 1,000-10,000 parts per million (ppm) per degrees Celsius and/or may be at least 100 times greater than that of the first material 122. Examples of materials that conform to this requirement include the above-listed electrically conductive metals such as Cu, Al, Ag, Au and certain alloys thereof. In an embodiment, the material which forms the first, second and third landing pads 112, 114, and 116 has a temperature coefficient of 3,500-4,500 parts per million (ppm) per degrees Celsius. Examples of materials that conform to this requirement include pure copper (Cu) and certain electrically conductive alloys of copper. The difference in temperature coefficient allows for precision in current measurement by maintaining a stable electrical resistance of the metal clip 100 over a wide operating range. As the metal clip 100 experiences resistive heating, e.g., in the case of a power applications wherein the magnitude of the operational current may exceed 1 A, 10 A or more, a voltage across the metal clip 100 does not significantly change and hence the accuracy of the current measurement remains high.

The multi-bridge configuration of the metal clip 100 advantageously lowers the temperature to resistance ratio of the metal clip 100 in an electrical device that utilizes the metal clip 100 as a current measurement shunt. That is, the features of the metal clip 100 allow for the metal clip 100 to operate at a lower temperature for a given voltage drop across the metal clip 100. While the types of materials suitable for the first material 122 offer low temperature coefficients, many electronic devices are unable to accommodate a metal clip 100 that operates at high temperatures, e.g., temperatures 200° C. or more. At these temperatures, dielectric mediums that encapsulate the metal clip 100, e.g., potting compounds or molding compounds, may mechanically fail and/or become detached from the metal clip 100. This places a limit on the amount of electrical resistance that the span of the metal clip 100 comprising the first material 122 can present, as higher values will result in higher temperatures due to resistive heating. The multi-bridge configuration lowers the resistive heating temperature of the metal clip 100 by dividing the parts of the metal clip 100 that represent most of its electrical resistance and operate at the highest temperature. As the material which forms the first, second and third landing pads 112, 114, and 116 has a high thermal conductivity, the heat generated by the first material 122 is extracted away and conducted through the first, second and third contact pads 104, 106, 108, which in turn may be thermally coupled to a heat sink. Stated another way, the multi-bridge configuration introduces an additional thermal conduction path into the middle of the resistive portion of the metal clip 100 whereby heat can be dissipated via the second contact pad 106. By lowering the temperature that the metal clip 100 experiences at a given current and electrical resistance, it is possible to obtain an increase the electrical resistance of the metal clip 100 without reaching or approaching potentially damaging temperature levels. This may be particularly beneficial in high power applications that require measurement of a very high load current, e.g., 1 A (amperes), 10 A, or more while simultaneously requiring voltage differences of at least, 120 mV (Millivolts), 150 mV, 200 mV or more across the current shunt to obtain an accurate measurement.

The metal clip 100 offers a high degree of precision in electrical resistance in combination with a low area consumption. In more detail, an important requirement for current measurement shunts is a low variation in electrical resistance across multiple nominally identical parts. That is, accurate current measurement is obtained when the resistance value of the metal clip 100 precisely conforms to a known value. One technique for maintaining a low variation in electrical resistance involves a post-processing step whereby a small amount of the first material 122 is removed to bring a tested resistance of the metal clip 100 into closer conformity with an expected value. Even still, there is a slight degree of electrical resistance variation after performing this technique. The multi-bridge configuration of the metal clip 100 is advantageous in this regard because the overall electrical resistance of the metal clip 100 can be tuned within the electrical resistance variation window of the post-processing step by removing the first material 122 from one or both of the first and second bridge sections 118, 120. By way of comparison, producing two separate metal clips increases the potential for variation because each device is tuned for electrical resistance separately and thus the possible variation between any two of these clips can be up to twice as much as a single component counterpart. Separately or in combination, the metal clip 100 requires a smaller area footprint in comparison to two separate metal clips because the second landing pad 114 replaces the need for two separate landing pads and corresponding contact pads.

Figure 2:
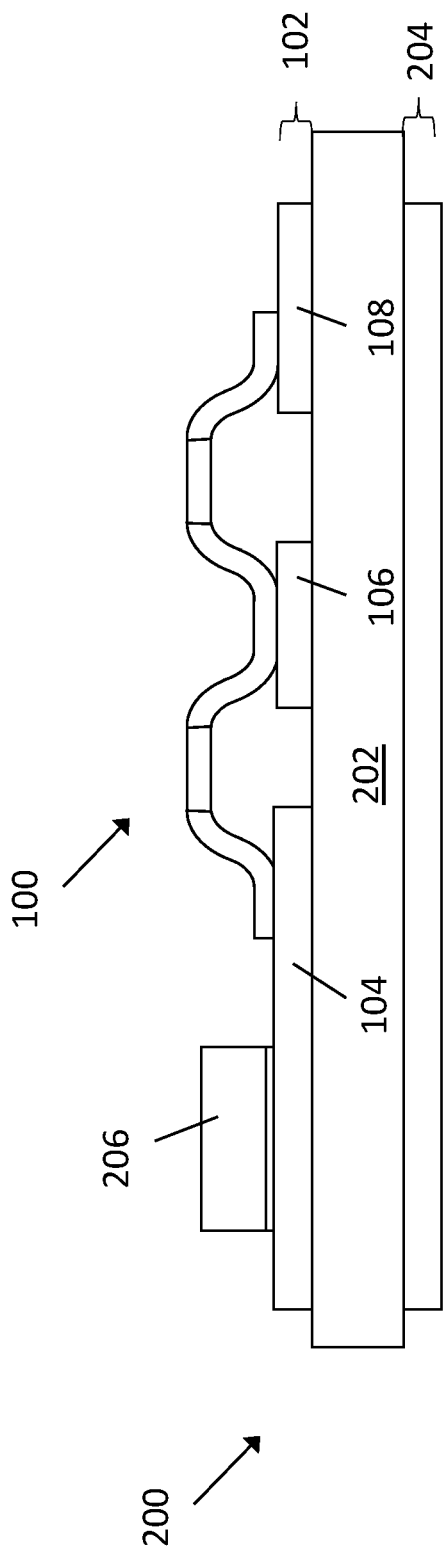
FIG. 2 illustrates a metal clip connected in a current shunt measurement arrangement with a semiconductor die that is mounted on a power electronics substrate, according to an embodiment.

Referring to FIG. 2, an electronic device that comprises a power electronics carrier 200 is shown. The power electronics carrier 200 may be a DCB substrate, a DAB substrate, an AMB substrate, or an IMS substrate, for example. The power electronics carrier 200 comprises an electrically insulating substrate 202. The electrically insulating substrate 202 can comprise electrically insulating material, e.g., ceramic material such as $Al_2O_3$(Alumina) AlN (Aluminum Nitride). The power electronics carrier 200 comprises a structured metallization layer 102 disposed on an upper surface of the electrically insulating substrate 202 and a second metallization layer 204 disposed on a lower surface of the electrically insulating substrate 202. The second metallization layer 204 can comprise an electrically conductive metal and can be used to thermally couple the power electronics carrier 200 to a heat sink.

The electronic device comprises the metal clip 100 mounted on the structured metallization layer 102 which corresponds to an upper-level metallization layer of the power electronics carrier 200. The electronic device additionally comprises a semiconductor die 206 mounted on the structured metallization layer 102. The metal clip 100, semiconductor die 206, and the power electronics carrier 200 may form part of an integrated power module, which may be configured as a power converter or inverter, for example. In that case, the semiconductor die 206 may be a power transistor die which forms a high-side switch or a low-side switch of a half-bridge circuit. In addition to the depicted elements, the power module may comprise one or more driver dies that control a switching operation of the half-bridge circuit. In addition, the power module may comprise a plastic housing that surrounds an interior volume over the power electronics carrier 200, a potting compound such as a silicone based potting compound that fills the interior volume and encapsulates the elements mounted on the power electronics carrier 200, and conductive terminals that protrude out of the housing and provide externally accessible points of electrical contact.

The metal clip 100 is mounted on the power electronics carrier 200 in a current shunt measurement with the semiconductor die 206. The semiconductor die 206 may be a vertical power transistor die, e.g., MOSFET, IGBT, etc., that is mounted on the first contact pad 104 of the structured metallization layer 102 with a load terminal of the vertical power transistor, e.g., source, drain, collector, emitter, etc. facing and electrically connected to the first contact pad 104, e.g., by a solder connection. The metal clip 100 may be arranged as a shunt for a phase current of the power conversion circuit, meaning that the output current of the half-bridge circuit flows through the metal clip 100. A magnitude of the phase current can be obtained in the above-described manner by obtaining the voltage difference between the first and third contact pads 104, 108 of the structured metallization layer 102. Heat that is generated by the metal clip 100 during operation of the power conversion circuit is advantageously dissipated by all three of the first, second and third contact pads 104, 106, 108 from the power electronics carrier 200, which in turn may be thermally coupled to a cooling apparatus such as a heat sink.

Figure 3:
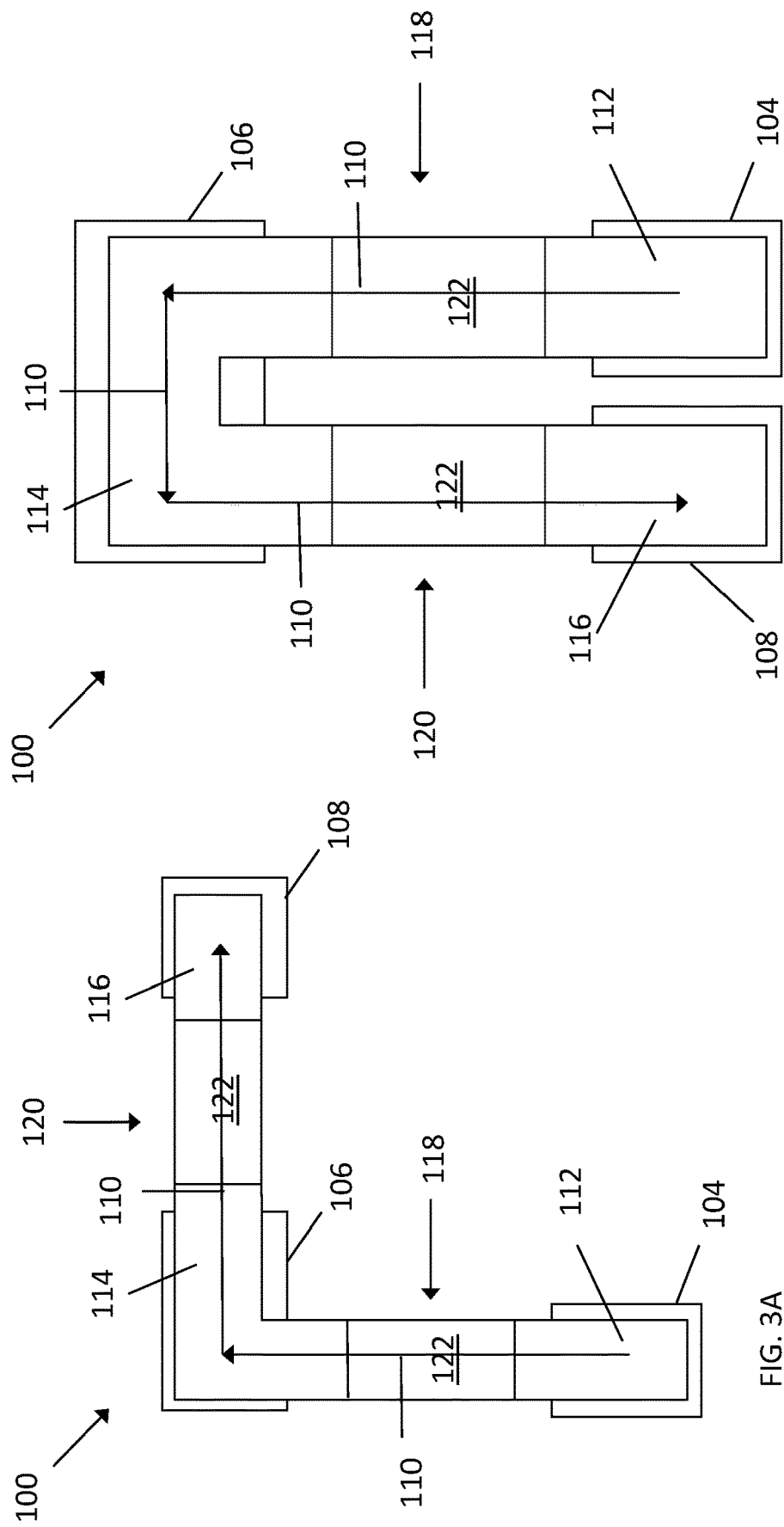
FIG. 3, which includes

Referring to FIG. 3, the metal clip 100 is depicted, according to two different embodiments. In each case, the metal clip 100 comprises the first and second bridge span 118, 120 being connected between the first, second and third landing pads 112, 114, and 116, as described above, and the first, second and third landing pads 112, 114, and 116 are respectively conductively attached to the first, second and third contact pads 104, 106, 108 from the structured metallization layer 102 in the same way as described above. The embodiments of FIG. 3 have a different geometry as the previously disclosed embodiment.

Referring to FIG. 3A, the metal clip 100 may have an angled geometry whereby the shunt current 110 of the metal clip 100 flows in a first direction between the first and second landing pads 112, 114 and in a second direction between the second and third landing pads 114, 116, and the first and second current flow directions are oriented transversely relative to one another. As shown, the metal clip 100 may be arranged to form a perpendicular angle at the second landing pad 114 such that the first and second current flow directions are perpendicular to one another. More generally, the metal clip 100 may have any non-linear geometry that redirects between the first and third landing pads 104, 108. Such an arrangement may be preferred in applications in which space constraints do not accommodate a linear geometry.

Referring to FIG. 3B, the metal clip 100 may have a reversing geometry whereby the electrical current of the metal clip 100 flows in a first direction between the first and second landing pads 112, 114 and in a second direction between the second and third landing pads 114, 116, and the first and second directions are antiparallel to one another. Another way to describe the metal clip 100 is a U-shaped structure whereby the operational current flows between first and third landing pads 104, 108 that are immediately adjacent to one another. Such an arrangement may be preferred in applications in which space constraints do not accommodate other geometries. Moreover, the geometry in FIG. 3B may be easier to manufacture, as the reversing geometry can be obtained by forming a central notch in a continuous structure.

Figure 4:
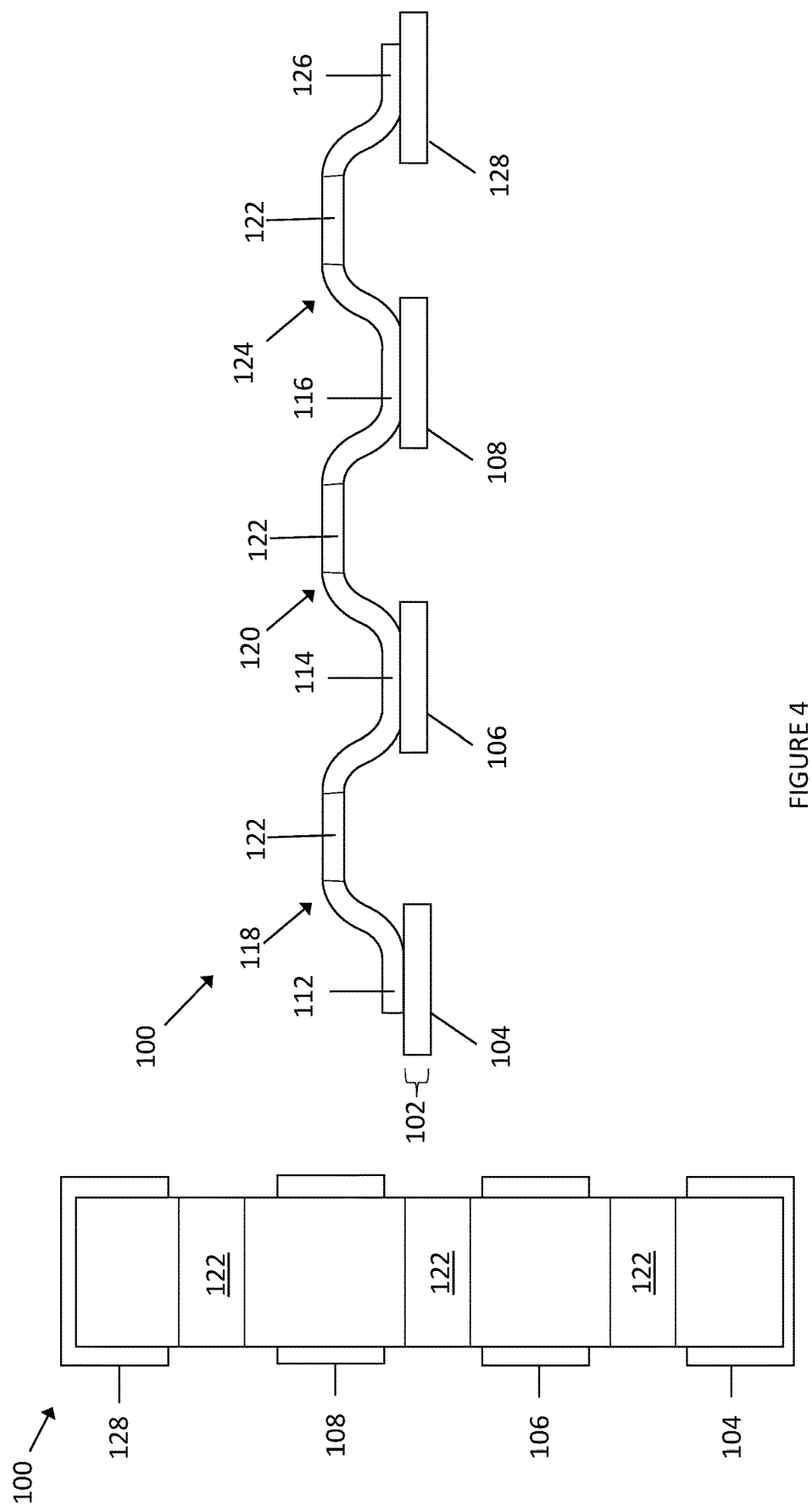
FIG. 4 illustrates a metal clip attached to a structured metallization layer, according to an embodiment.

Referring to FIG. 4, the metal clip 100 is depicted, according to another embodiment. The metal clip 100 differs from the previously described embodiments in that it further comprises a third bridge span 124 connected between the third landing pad 116 and a fourth landing pad 126. The third bridge span 124 comprises a section of the first material 122 in a corresponding manner as the first and second bridge spans 118, 120. The fourth landing pad 126 is formed from the same thermally and electrically conductive metal as the first, second and third landing pads 112, 114, and 116. In other words, the multi-bridge concept of the metal clip 100 is extended to include an additional bridge span. In this case, the fourth landing pad 126 is attached to a fourth mounting pad 128 from the structured metallization layer 102. The fourth mounting pad 128 in combination with the first mounting pad 104 serve as first and second measurement modes that can be used to obtain a current measurement in the above-described manner. In this example, both the second and third contact pads 106, 108 can be electrically floating, and can both serve a purely cooling function. The three-bridge span configuration of FIG. 4 represents a way to further increase to the electrical resistance of the metal clip 100 by adding additional spans of a resistive alloy while simultaneously providing the advantageous cooling benefit from interruptions in the resistive bridge material, as described above. This concept can be extended to greater numbers of bridge spans, e.g., four, five, six, etc., to obtain further increases in electrical resistance with the same advantageous cooling benefit being obtained.

Figure 5:
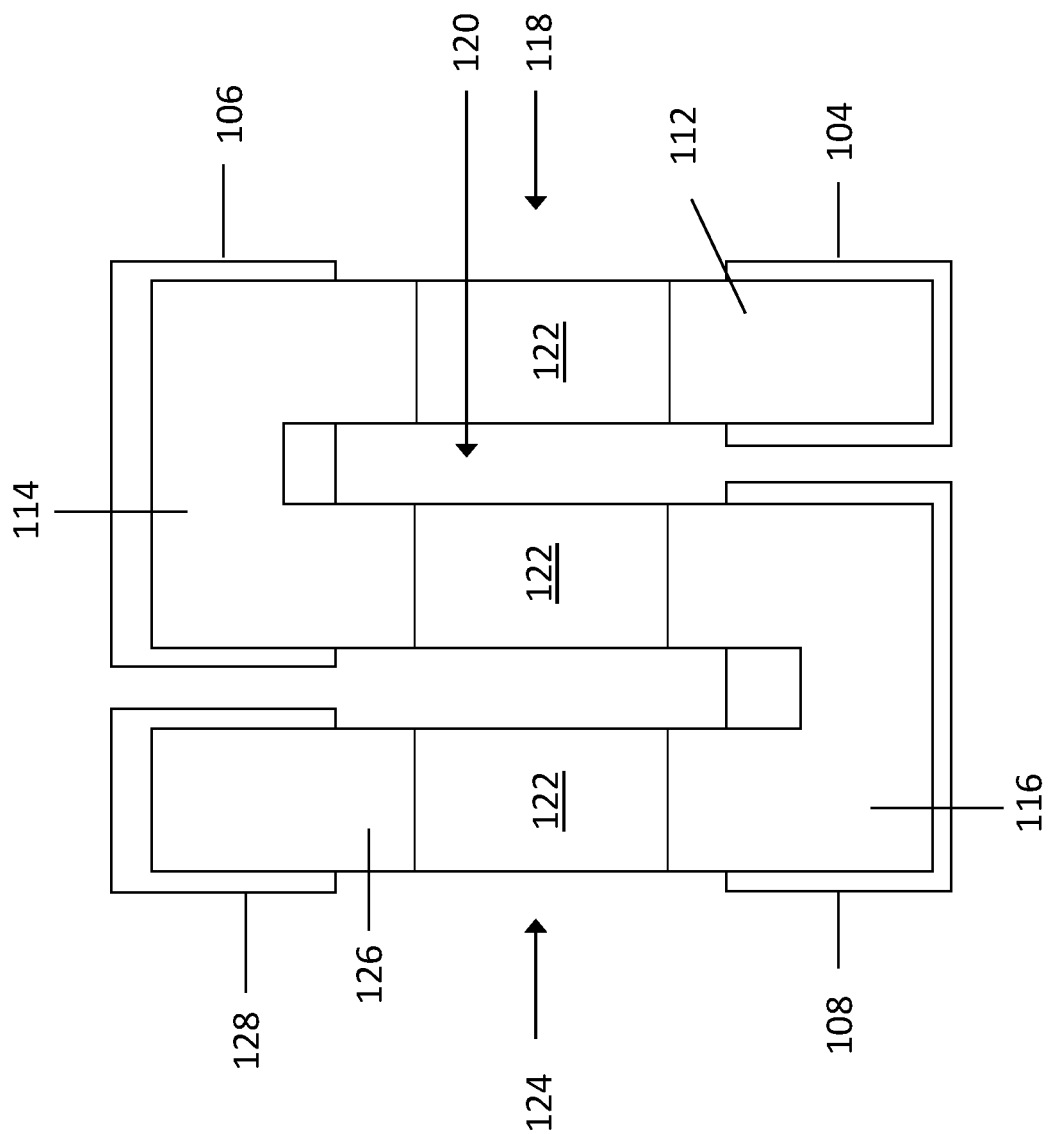
FIG. 5 illustrates a metal clip attached to a structured metallization layer, according to an embodiment.

Referring to FIG. 5, the metal clip 100 is depicted, according to another embodiment. The metal clip 100 of FIG. 5 comprises first, second and third bridge spans 118, 120 and 124, and comprises first, second, third and fourth landing pads 112, 114, 116 and 126, in a similar manner as the embodiment disclosed above. Instead of a linear geometry, the embodiment of FIG. 4 has a meandering geometry wherein multiple sections having a reversing geometry as described with reference to FIG. 3B are strung together. This geometry represents a way to obtain the increased electrical resistance from multiple bridge sections with the first material 122, while also providing a compact footprint that may be preferred in certain applications. This meandering geometry concept can be extended to greater numbers of bridge spans, e.g., four, five, six, etc., to obtain further increases in electrical resistance with the same advantageous cooling benefit being obtained.

Although the present disclosure is not so limited, the following numbered examples demonstrate one or more aspects of the disclosure.

Example 1. An electronic device, comprising: a structured metallization layer comprising a plurality of contact pads that are electrically isolated from one another; and a metal clip connected in a current shunt measurement arrangement with a semiconductor device, wherein the metal clip comprises first, second and third landing pads, a first bridge span connected between the first and second landing pads, and second bridge span connected between the second and third landing pads, wherein the first, second third landing pads are respectively thermally conductively attached to first, second and third contact pads from the structured metallization layer, and wherein the second mounting pad is electrically floating.

Example 2. The electronic device of claim 1, wherein the first and second bridge spans are sections of a first conductive material that shunt current of the metal clip must pass through, and wherein a temperature coefficient of the first conductive material is lower than a temperature coefficient the first, second and third landing pads.

Example 3. The electronic device of example 2, wherein the first conductive material is a resistive alloy with a temperature coefficient that is between 20 and 60° C. lower than that of the first, second and third landing pads, and wherein first, second and third landing pads are sections of copper or copper alloy.

Example 4. The electronic device of example 2, wherein the metal clip has a linear geometry whereby the shunt current of the metal clip flows linearly between the first, second and third landing pads.

Example 5. The electronic device of example 2, wherein the metal clip has an angled geometry whereby the shunt current of the metal clip flows in a first direction between the first and second landing pads and in a second direction between the second and third landing pads, and wherein the first and second directions are oriented transversely relative to one another.

Example 6. The electronic device of example 2, wherein the metal clip has a reversing geometry whereby the shunt current of the metal clip flows in a first direction between the first and second landing pads and in a second direction between the second and third landing pads, and wherein the first and second directions are antiparallel to one another.

Example 7. The electronic device of example 1, wherein the metal clip further comprises a fourth landing pad, and a third bridge span connected between the third and fourth landing pads, wherein the fourth landing pad is attached to a fourth mounting pad from the structured metallization layer, and wherein the third mounting pad is electrically floating.

Example 8. The electronic device of example 1, wherein the first bridge span is elevated from the first and second landing pads, and wherein the second bridge span is elevated from the second and third landing pads.

Example 9. The electronic device of example 1, wherein the structured metallization layer is an upper-level metallization layer of a power electronics carrier, wherein the semiconductor device is a vertical power transistor die that is mounted on the upper-level metallization layer, and wherein the metal clip is connected to an output terminal of the vertical power transistor die.

Example 10. The electronic device of example 10, wherein the electronic device is configured as a power module that comprises a power conversion circuit, and wherein the metal clip is arranged as a shunt for a phase current of the power conversion circuit.

Example 11. A metal clip, comprising: first, second and third landing pads; a first bridge span connected between the first and second landing pads; and a second bridge span connected between the second and third landing pads, wherein the metal clip is arranged to conduct a shunt current from the first landing pad to the third landing pad, wherein the first and second bridge spans comprise sections of a first conductive material that the shunt current must pass through, and wherein a temperature coefficient of the first conductive material is lower than that of the first, second and third landing pads.

Example 12. The metal clip of example 11, wherein the first conductive material is a resistive alloy with a temperature coefficient that is between 20 and 60° C. lower than that of the first, second and third landing pads, and wherein first, second and third landing pads are sections of copper or copper alloy.

Example 13. The metal clip of example 12, wherein the first conductive material is an alloy of manganese or an alloy of chromium.

Example 14. The metal clip of example 11, wherein the metal clip has a linear geometry whereby the shunt current flows in a single linear direction between the first, second and third landing pads.

Example 15. The metal clip of example 11, wherein the metal clip has an angled geometry whereby the shunt current flows in a first direction between the first and second landing pads and in a second direction between the second and third landing pads, and wherein the first and second directions are oriented transversely relative to one another.

Example 16. The metal clip of example 11, wherein the metal clip has a reversing geometry whereby the shunt current of the metal clip flows in a first direction between the first and second landing pads and in a second direction between the second and third landing pads, and wherein the first and second directions are antiparallel to one another.

Example 17. The metal clip of example 11, wherein the metal clip further comprises a fourth landing pad, and a third bridge span connected between the third and fourth landing pads, wherein the third bridge span comprises a section of the first conductive material that the shunt current must pass through.

Example 18. The metal clip of example 11, wherein the first bridge span is elevated from the first and second landing pads and wherein the second bridge span is elevated from the second and third landing pads.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device, comprising:
a structured metallization layer comprising a plurality of contact pads that are electrically isolated from one another; and
a metal clip connected in a current shunt measurement arrangement with a semiconductor device,
wherein the metal clip comprises first, second and third landing pads, a first bridge span connected between the first and second landing pads, and
second bridge span connected between the second and third landing pads,
wherein the first, second third landing pads are respectively thermally conductively attached to first, second and third contact pads from the structured metallization layer, and
wherein the second mounting pad is electrically floating.

2. The electronic device of claim 1, wherein the first and second bridge spans are sections of a first conductive material that shunt current of the metal clip must pass through, and wherein a temperature coefficient of the first conductive material is lower than a temperature coefficient the first, second and third landing pads.

3. The electronic device of claim 2, wherein the first conductive material is a resistive alloy with a temperature coefficient that is between 20 and 60° C. lower than that of the first, second and third landing pads, and wherein first, second and third landing pads are sections of copper or copper alloy.

4. The electronic device of claim 2, wherein the metal clip has a linear geometry whereby the shunt current of the metal clip flows linearly between the first, second and third landing pads.

5. The electronic device of claim 2, wherein the metal clip has an angled geometry whereby the shunt current of the metal clip flows in a first direction between the first and second landing pads and in a second direction between the second and third landing pads, and wherein the first and second directions are oriented transversely relative to one another.

6. The electronic device of claim 2, wherein the metal clip has a reversing geometry whereby the shunt current of the metal clip flows in a first direction between the first and second landing pads and in a second direction between the second and third landing pads, and wherein the first and second directions are antiparallel to one another.

7. The electronic device of claim 1, wherein the metal clip further comprises a fourth landing pad, and a third bridge span connected between the third and fourth landing pads, wherein the fourth landing pad is attached to a fourth mounting pad from the structured metallization layer, and wherein the third mounting pad is electrically floating.

8. The electronic device of claim 1, wherein the first bridge span is elevated from the first and second landing pads, and wherein the second bridge span is elevated from the second and third landing pads.

9. The electronic device of claim 1, wherein the structured metallization layer is an upper-level metallization layer of a power electronics carrier, wherein the semiconductor device is a vertical power transistor die that is mounted on the upper-level metallization layer, and wherein the metal clip is connected to an output terminal of the vertical power transistor die.

10. The electronic device of claim 9, wherein the electronic device is configured as a power module that comprises a power conversion circuit, and wherein the metal clip is arranged as a shunt for a phase current of the power conversion circuit.

11. A metal clip, comprising:
first, second and third landing pads;
a first bridge span connected between the first and second landing pads; and
a second bridge span connected between the second and third landing pads,
wherein the metal clip is arranged to conduct a shunt current from the first landing pad to the third landing pad,
wherein the first and second bridge spans comprise sections of a first conductive material that the shunt current must pass through, and
wherein a temperature coefficient of the first conductive material is lower than that of the first, second and third landing pads.

12. The metal clip of claim 11, wherein the first conductive material is a resistive alloy with a temperature coefficient that is between 20 and 60° C. lower than that of the first, second and third landing pads, and wherein first, second and third landing pads are sections of copper or copper alloy.

13. The metal clip of claim 12, wherein the first conductive material is an alloy of manganese or an alloy of chromium.

14. The metal clip of claim 11, wherein the metal clip has a linear geometry whereby the shunt current flows in a single linear direction between the first, second and third landing pads.

15. The metal clip of claim 11, wherein the metal clip has an angled geometry whereby the shunt current flows in a first direction between the first and second landing pads and in a second direction between the second and third landing pads, and wherein the first and second directions are oriented transversely relative to one another.

16. The metal clip of claim 11, wherein the metal clip has a reversing geometry whereby the shunt current of the metal clip flows in a first direction between the first and second landing pads and in a second direction between the second and third landing pads, and wherein the first and second directions are antiparallel to one another.

17. The metal clip of claim 11, wherein the metal clip further comprises a fourth landing pad, and a third bridge span connected between the third and fourth landing pads, wherein the third bridge span comprises a section of the first conductive material that the shunt current must pass through.

18. The metal clip of claim 11, wherein the first bridge span is elevated from the first and second landing pads and wherein the second bridge span is elevated from the second and third landing pads.

* * * * *

UNITED STATES PATENT AND TRADEMARK OFFICE
CERTIFICATE OF CORRECTION

PATENT NO. : 11,810,888 B2
APPLICATION NO. : 17/715434
DATED : November 7, 2023
INVENTOR(S) : A. Schulz Page 1 of 1

It is certified that error appears in the above-identified patent and that said Letters Patent is hereby corrected as shown below:

On the Title Page

Column 2, abstract (Line 9), please change "second third" to -- second and third --.

Signed and Sealed this
Twenty-seventh Day of February, 2024

Katherine Kelly Vidal
*Director of the United States Patent and Trademark Office*